United States Patent
Zhu et al.

(10) Patent No.: US 7,791,161 B2
(45) Date of Patent: Sep. 7, 2010

(54) SEMICONDUCTOR DEVICES EMPLOYING POLY-FILLED TRENCHES

(75) Inventors: Ronghua Zhu, Chandler, AZ (US); Vishnu K. Khemka, Phoenix, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 975 days.

(21) Appl. No.: 11/213,069

(22) Filed: Aug. 25, 2005

(65) Prior Publication Data

US 2007/0045767 A1 Mar. 1, 2007

(51) Int. Cl.
*H01L 29/00* (2006.01)
(52) U.S. Cl. .................. 257/505; 257/378; 257/510; 257/513; 257/221; 257/224; 257/466; 257/333; 257/328; 257/244; 257/118; 257/E21.546; 257/E21.55; 257/E21.54; 257/E21.628
(58) Field of Classification Search .......... 257/510, 257/378, 505, 513, 466, 333, 328, 118, 221, 257/224, E21.546, E21.55, E21.54, E21.628
See application file for complete search history.

(56) References Cited

U.S. PATENT DOCUMENTS

| | | | | |
|---|---|---|---|---|
| 4,670,669 | A * | 6/1987 | Cottrell et al. | 327/536 |
| 5,169,794 | A | 12/1992 | Iranmanesh | |
| 5,856,695 | A | 1/1999 | Ito et al. | |
| 6,194,761 | B1 * | 2/2001 | Chiozzi et al. | 257/328 |
| 2004/0157406 | A1 * | 8/2004 | Ibara | 438/435 |
| 2004/0248370 | A1 * | 12/2004 | Shin et al. | 438/306 |
| 2005/0093097 | A1 | 5/2005 | Baiocchi et al. | |
| 2006/0076629 | A1 * | 4/2006 | Yilmaz | 257/378 |

FOREIGN PATENT DOCUMENTS

CN 1560925 1/2005

OTHER PUBLICATIONS

Shenoy et al., "A Novel P Polysilicon/N-SIC Heterojunction Trench Gate Vertical FET," 1997 IEEE, pp. 365-368.
Adriaan W. Ludikhuize, "Self-aligned and Shielded-Resurf LDMOS for dense 20V Power IC's," 1999 IEEE, pp. 81-84.

(Continued)

*Primary Examiner*—Wael M Fahmy
*Assistant Examiner*—Marc Armand
(74) *Attorney, Agent, or Firm*—Ingrassia, Fisher & Lorenz, P.C.

(57) ABSTRACT

Structure and method are provided for semiconductor devices. The devices include trenches filled with highly doped polycrystalline semiconductor, extending from the surface into the body of the device for, among other things: (i) reducing substrate current injection, (ii) reducing ON-resistance and/or (iii) reducing thermal impedance to the substrate. For isolated LDMOS devices, the resistance between the lateral isolation wall (tied to the source) and the buried layer is reduced, thereby reducing substrate injection current. When placed in the drain of a lateral device or in the collector of a vertical device, the poly-filled trench effectively enlarges the drain or collector region, thereby lowering the ON-resistance. For devices formed on an oxide isolation layer, the poly-filled trench desirably penetrates this isolation layer thereby improving thermal conduction from the active regions to the substrate. The poly filled trenches are conveniently formed by etch and refill. Significant area savings are also achieved.

15 Claims, 8 Drawing Sheets

OTHER PUBLICATIONS

Zhu et al., "Suppression of substrate injection by RESURF LDMOS devices in a smart power technology for 20-30V applications," 1998 IEEE, pp. 184-186.

Cai et al., "A Partial SOI Technology for Single-Chip RF Power Amplifiers," 2001 IEEE, pp. 40.3.1-40.3.4.

Roig et al., "Efficiency of SOI-Like Structures for Reducing the Thermal Resistance in Thin-Film SOI Power LDMOSFETs," 2004 IEEE, pp. 743-745.

* cited by examiner

SEMICONDUCTOR DEVICES EMPLOYING POLY-FILLED TRENCHES

The present invention generally relates to semiconductor devices, and more particularly to semiconductor devices employing one or more trenches filled with a polycrystalline semiconductor.

BACKGROUND

Semiconductor (SC) devices suffer from a number of well known limitations. The limitations depend upon the type of device and the operating condition. Non-limiting examples of such limitations are ON-resistance, breakdown voltage, heat dissipation capability, substrate leakage current, energy handling capability, device area, and so forth. Many of these limitations can be of special concern in lateral and vertical devices. Thus, there continues to be a need for improved semiconductor devices, especially devices that must handle substantial power or voltage or both.

Accordingly, it is desirable to provide improved semiconductor devices, for both vertical and lateral types of devices. Non-limiting examples of lateral devices are LDMOS, Isolated LDMOS, RESURF LDMOS, Double RESURF LDMOS devices and the like. In addition, it is desirable that the improved device structures and method be adaptable to devices formed on bulk SC substrates as well as for devices formed on insulating layers, for example, semiconductor-on-insulator (SOI) types of devices. It is further desirable that the improved device structures be achieved using processing technology already available for other purposes so that little or no modification of the manufacturing process is required. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "in," "out," "front," "back," "up," "down, "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

For convenience of explanation, the invention is described herein for N-channel lateral devices and NPN vertical devices manufactured on and/or in silicon semiconductor substrates or silicon SOI substrates, but this is not intended to be limiting and persons of skill in the art will understand that the structure and principles taught herein also apply to P-channel lateral and PNP vertical devices wherein, for example, the conductivity types of the various regions shown herein are replaced by their opposites, and to other types of semiconductor materials and devices as well. While poly-silicon is preferred for filling the trenches used in embodiments of the present invention, the embodiments are not limited to this choice of conductor and other types of materials (e.g., metals, other semi-conductors, semi-metals, and/or combinations thereof) that are compatible with other aspects of the device manufacturing process may also be used. Thus, the terms "poly-filled" and "poly-silicon filled" are intended to include such other materials and material combinations in addition to silicon.

Figure 1:
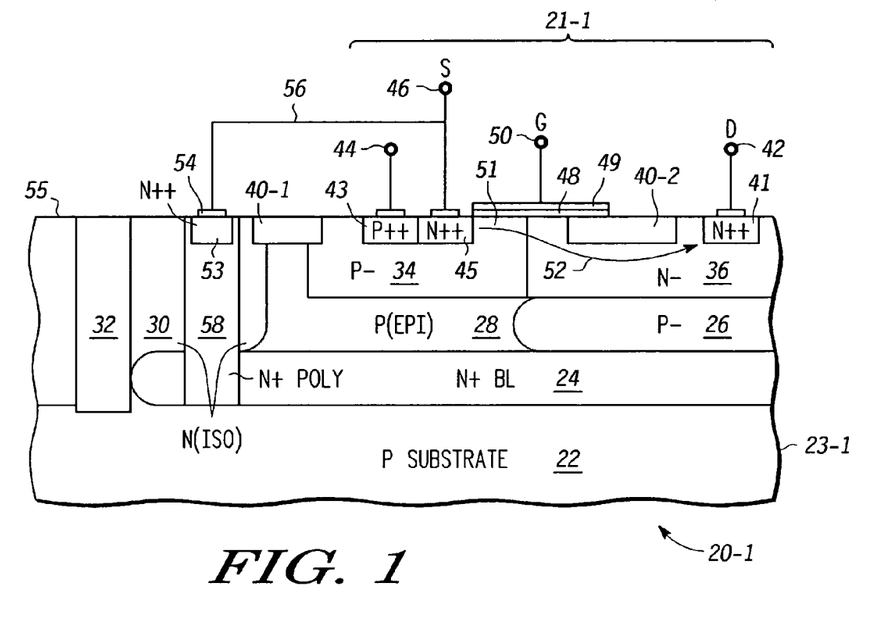
FIGS. 1-2 are simplified schematic cross-sectional side views of first and second types of semiconductor devices according to embodiments of the present invention, each employing a poly-filled trench.
Figure 2:
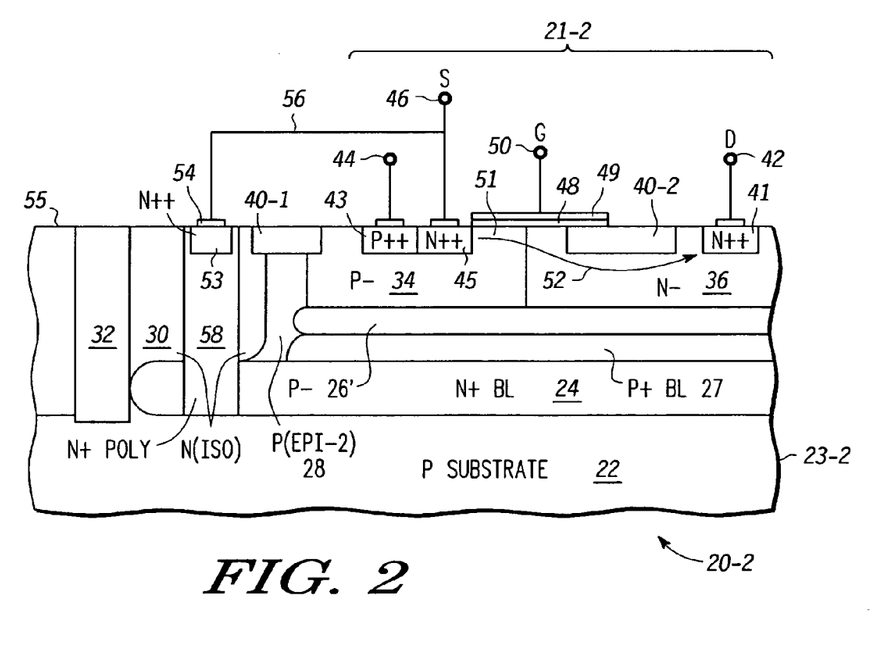

FIG. 1 is a simplified schematic cross-sectional side view through first semiconductor device 20-1 according to an embodiment of the present invention and FIG. 2 is a simplified schematic cross-sectional side view through second semiconductor device 20-2 according to another embodiment of the present invention. Devices 20-1 and 20-2 employ poly-filled trench 58 located in N isolation region (N(ISO)) 30. Devices 20-1, 20-2 (collectively "20") are similar and accordingly are described together. Device 20-2 differs from device 20-1 by having additional P+ buried layer (P+ BL) 27. This is not essential to the present invention. Devices 20 are LDMOS devices intended for use as isolated LDMOS (ILDMOS) devices. Devices 20 comprises P semiconductor substrate 22 above which is N+ buried layer (N+ BL) 24. P(epi) layer 28 having outer surface 55 is located above N+ BL 24. Layer 28 is preferably formed by epitaxial deposition. N+ BL 24 may also be formed by epitaxial deposition or formed by ion implantation or other suitable doping procedure. While epitaxial deposition and ion implantation are preferred for the formation of various layers or regions in devices 20, they are not essential and any convenient fabrication technique may be used. Devices 20 are laterally separated from adjacent devices or semiconductor regions by circumferential (e.g., dielectric) isolation wall 32, preferably formed of insulating oxide, but other isolation arrangements may also be used. Isolation wall 32 conveniently extends from surface 55 to substrate 22. N(ISO) region or well 30 is provided (e.g., by ion implantation) adjacent isolation wall 32 and extending substantially from surface 55 through P(epi) layer 28 to N+ BL 24. P-well 34 and N-well 36 are provided (e.g., by ion implantation) within P(epi) layer 28 extending toward but generally not contacting N+ BL 24. In device 20-1, P− region 26 is provided between N-well 36 and N+ BL 24. In device 20-2, P− region 26' and P+ BL 27 are provided extending under both P− well 34 and N-well 36, between those regions and N+ BL 24. P++ base contact region 43 with connection 44 and N++ source region 45 with source connection 46 are provided in P-well 34. Regions 43 and 45 may be shorted together, but this is not essential to the present invention. N++ drain region 41 with drain connection 42 is provided in N-well 36. Oxide (or other dielectric) isolation regions 40-1, 40-2 are provided at surface 55, wherein region 40-1 extends between N(ISO) region 30 and P-well 34 and region 40-2 lies in N-well or region 36 slightly separated from drain region 41. Gate insulator 48 surmounted by gate conductor 49 and gate connection 50 are provided on surface 55 extending laterally from source region 45 above channel region 51 and across a portion of N-well 36 and part of oxide region 40-2 toward drain region 41. During operation of devices 20, current 52 flows substantially laterally from source region 45 to drain region 41. N++ region 53 and connection 54 are provided for making electrical contact with N isolation region (N(ISO)) 30, and through N(ISO) 30 with N+ BL 24. For an ILDMOS device, N++ region 53 with connection 54 is optionally coupled to source region 45 with connection 46, e.g., by metal layer connection 56, but any connection means may be used. Connection 56 is useful but not essential. Devices 20 of the invention embodiments include heavily doped (e.g., about 1E19/cc or higher) N+ poly-filled trench 58 extending through N(ISO) region 30 from N++ region 53 into N+ BL 24. Poly-filled trench 58 may extend to or into P substrate 22, but this is not essential. The function of poly-filled trench 58 is, among other things, to reduce the series resistance of the connection to N+ BL 24.

In order to better understand the benefit of including poly-filled trench 58, it is useful to consider the operation of devices 20 with this region omitted. Without poly-filled trench 58, the resistance of the connection to N+ BL 24 is generally higher because of the practical difficulty of highly doping deep N(ISO) region 30. This can lead to substantial minority carrier injection into the substrate during inductive switching when drain 41 may go negative. This minority carrier injection can be very large in high power devices and cause significant problems with circuit operation. When device current is small, coupling N(ISO) region 30 to source region 45 (e.g., by connection 56) can reduce or eliminate the minority carrier injection. Alternatively, N(ISO) region 30 may be separately biased. But when the device current is large, then the current passing through N(ISO) region 30 from N+ BL 24 may be sufficiently large that the voltage drop in N(ISO) region 30 and N+ BL 24 caused by this current may turn on the substrate isolation diode (e.g., regions 24 and 22) and/or the parasitic PNP transistor formed by regions 26, 24 and 22 inherent in such LDMOS devices, and thereby lead to high power dissipation. It is difficult to increase the doping throughout ion implanted N(ISO) region 30 sufficiently to avoid this problem. However, the use of poly-filled trench 58 provides much reduced vertical resistance and the substrate minority carrier injection problem can be largely avoided. This results in a significant improvement in device properties.

Figure 3:
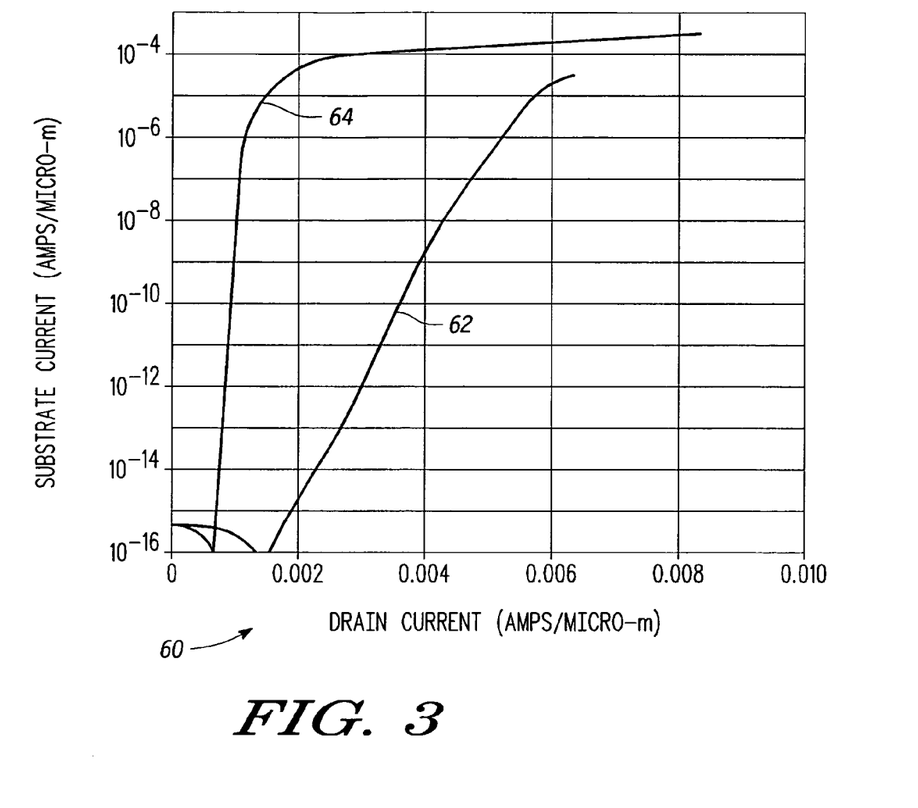
FIG. 3 shows a plot of substrate current verses drain current for the semiconductor device of FIG. 1 compared to an otherwise substantially similar device without the poly-filled trench provided in FIG. 1.

The efficacy of poly-filled trench 58 in reducing minority carrier injection in devices 20 can be seen by considering the data presented in FIG. 3. FIG. 3 shows plot 60 of substrate current verses drain current (both in amps per micrometer of channel width) for the semiconductor device of FIG. 1, compared to an otherwise substantially similar device without poly-filled trench 58. Trace 62 shows the results for a device according to the present invention including poly-filled trench 58 and trace 64 shows the results for an otherwise substantially identical device without poly-filled trench 58. It will be noted that the minority carrier injection occurring in the device including poly-filled trench 58 is much less than for the device without this feature at substantially all drain current levels.

Another advantage of the embodiments of the present invention employing poly-filled trench 58 is that the device area can be reduced. This is a very significant consideration since the manufacturing cost of most semiconductor devices tends to be approximately related to their area. Referring again to FIGS. 1-2, devices 20 have active region unit cell widths 21-1, 21-2 respectively (collectively 21). Other unit cells (e.g., mirror imaged) are typically placed to the right of boundaries 23-1, 23-2 (collectively 23) so that N>1 active device regions are contained within a single N(ISO) region 30 and isolation wall 32. For example, in an ILDMOS device without poly-filled trench 58 intended to operate at about 35 volts and handle large currents (e.g., about 1 to 10 amps) in the reverse injection mode, the average cell width [(N×width 21 plus isolation width)/N] is about 28.4 micrometers. This is because relatively wide N(ISO) regions 30 are placed around the N unit cells in various embodiments. Where N is small, e.g., N=1 or N−2, the combined effective unit cell width is large. This minimizes resistance so that the minority carrier injection problem described above is minimized. In contrast, with devices 20 utilizing poly-filled trench 58, the reduction in series resistance in N(ISO) region 30 allows more (e.g., N>>2) active device unit cells 21 to be placed within the same isolation region so that the combined effective cell width can be reduced to about 8.4 micrometers. Thus, a reduction in effective device area of as much as 70% can be achieved. This can result in a very significant reduction in device size and corresponding reduction in cost.

Figure 4:
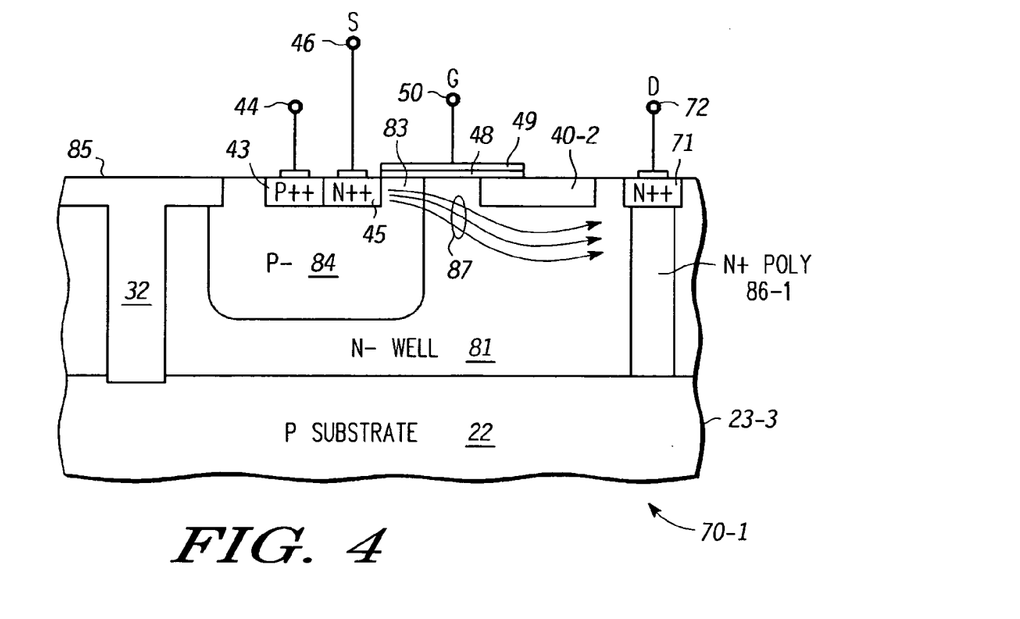
FIGS. 4-10 are simplified schematic cross-sectional side views of third through ninth types of semiconductor devices according to embodiments of the present invention, each employing a poly-filled trench.
Figure 5:
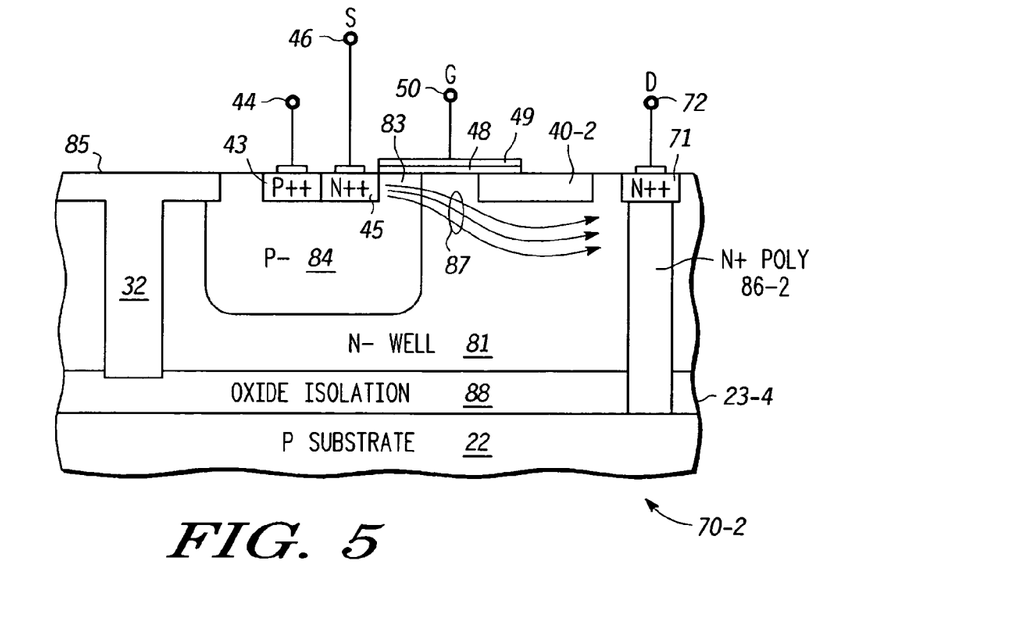

FIGS. 4-10 are simplified schematic cross-sectional side views through third through ninth types of semiconductor devices 70, 90, 100 according to various embodiments of the present invention, employing poly-filled trenches 86, 92, 116, respectively. Devices 70-1, 70-2 (collectively "70")' of FIGS. 4-5 are generally similar and will be described together.

Device 70-2 differs from device 70-1 by inclusion of isolation layer 88. Layer 88 is conveniently of silicon oxide but other insulating dielectrics may also be used. For convenience of explanation and not intended to be limiting layer 88 is referred to as "oxide layer" or "oxide isolation layer" 88, but it will be understood that the term "oxide" as used herein is intended to include other insulating dielectric materials as well. Isolation layer 88 may be formed by oxidation or deposition or other convenient technique (such as conventional techniques used in making silicon-on-insulator substrates). Devices 70 comprise P substrate 22. In device 70-2 isolation layer 88 is grown or deposited on P substrate 22. In device 70-1, isolation layer 88 is omitted and a semiconductor layer or region is provided on P substrate 22. N-well 81 having upper surface 85 is formed therein, generally extending to P substrate 22 in device 70-1 or to isolation layer 88 in device 70-2. P-well 84 analogous to P-well 34 of FIGS. 1-2 is formed in N-well 81 extending from surface 85 toward P substrate 22 in device 70-1 and toward isolation layer 88 in device 70-2. Dielectric (e.g., oxide) isolation wall 32 extending from surface 85 to substrate 22 provides lateral isolation of devices 70. P++ region 43 with connection 44 and N++ source region 45 with connection 46 analogous to similarly identified regions in FIGS. 1-2 and performing similar functions are provided in P-well 84. N++ drain region 71 with connection 72 is provided in N-well region 81 separated from P-well 84. Oxide region 40-2 analogous to similarly identified region in FIGS. 1-2 is provided in surface 85 between drain region 71 and P-well 84. Gate dielectric 48 with overlying gate electrode 49 and connection 50 analogous to similarly identified elements in FIGS. 1-2 are provided on surface 85 extending substantially from source region 45, over channel region 83, across a portion of N-well 81 and oxide region 40-2, toward but generally not as far as drain region 71. Highly doped (e.g. 1E19/cc) N+ poly-filled trench 86-1, 86-2 (collectively "86") extends from drain region 71 through N-well 81 substantially to or into P substrate 22. In device 70-2 it desirably extends through oxide isolation layer 88 to contact P substrate 22. In normal operation current 87 flows from source 45 through channel region 83 and across the intervening portion of N-well 81 to drain region 71. The presence of N+ poly-filled trenches 86 significantly reduces the ON-resistance of devices 70 by providing a larger effective drain region of lower resistance, whereby current 87 can spread deeper into N-well 81 and avoid the current crowding that otherwise occurs near drain region 71 in the absence of N+ poly-filled trenches 86. In addition to lowering the ON-resistance of device 70-2 N+ poly-filled trench 86-2 performs another useful function of providing improved thermal coupling from surface 85 of device 70-2 to substrate 22. This is because, in device 70-2, oxide isolation layer 88 introduces much higher thermal impedance between the active device regions and the substrate. Therefore, having poly-filled trench 86-2 penetrate layer 88 and make direct thermal contact with substrate 22 provides significantly lower thermal impedance than would otherwise be obtained in such an SOI structure. This is a significant advantage. Devices 70 may be laterally mirrored about a plane passing vertically through poly-filled trench 86, but this is not essential.

Figure 6:
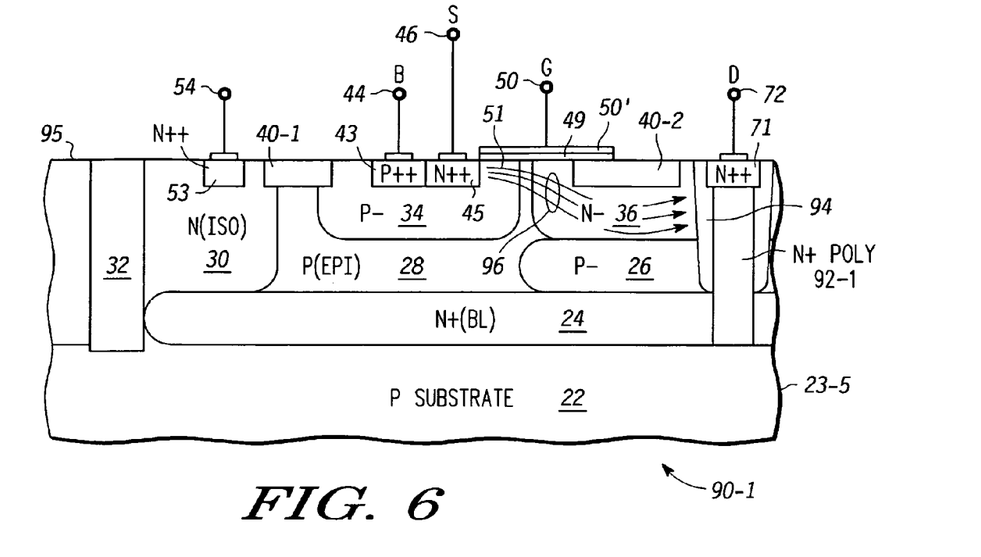
Figure 7:
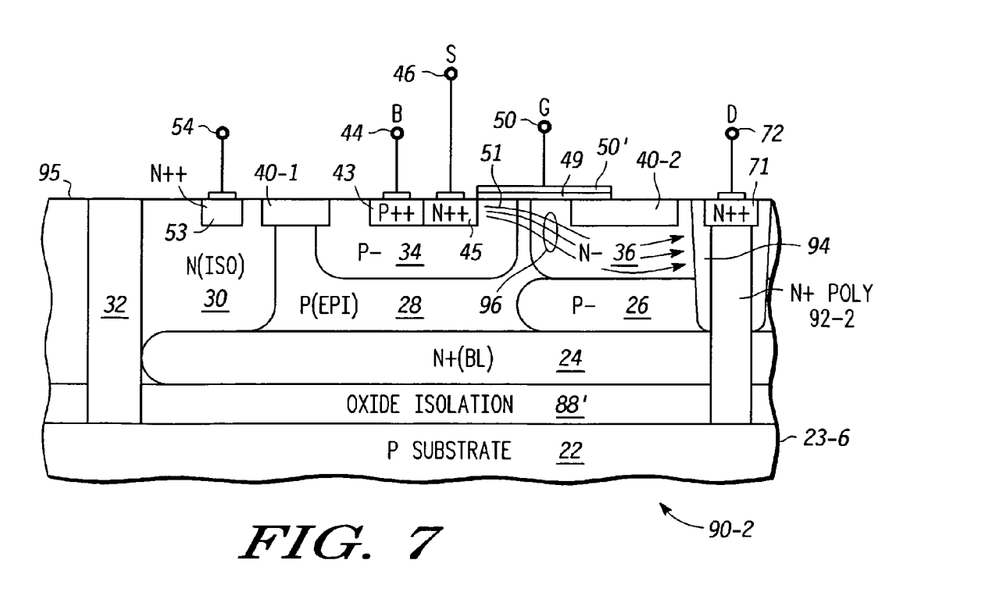

Referring now to FIGS. 6-7, devices 90-1, 90-2 (collectively "90") of FIGS. 6-7 are generally similar and will be described together. Device 90-2 differs from device 90-1 by inclusion in device 90-2 of isolation layer 88' analogous to isolation layer 88 of FIGS. 4-5. As previously noted, layer 88' like layer 88 is conveniently of silicon oxide but other insulating dielectrics may also be used. Devices 90 are generally similar to device 20 of FIG. 1 and the same reference numbers are used to identify analogous regions and the discussion of those analogous regions in connection with FIG. 1 is incorporated herein by reference. Devices 90 of FIGS. 6-7 do not have N+ poly-filled trench 58 and connection 56 linking N(ISO)) region 30 to source region 45. In devices 90 N++ drain regions 71 and connections 72 analogous to similarly identified regions in FIGS. 4-5 are provided in surface 95 of devices 90 analogous to surface 85 of devices 70. Devices 90 of FIGS. 6-7, like devices 70 of FIGS. 4-5 have N+ poly-filled trenches 92-1, 92-2 (collectively "92") extending from drain regions 71 to P substrate 22. In device 90-1, N+ poly-filled trench 92-1 conveniently extends to or through N+ BL 24 to P substrate 22, but the amount of overlap is not critical as long as it makes good electrical contact to N+ BL 24. In device 90-2 N+ poly-filled trench 92-2 desirably extends through oxide isolation layer 88' to P substrate 22 in order to provide improved thermal conduction to substrate 22 for the same reasons as explained in connection with device 70-2 of FIG. 5. N doped regions 94 can occur around N+ poly-filled trenches 92 as a consequence of out-diffusion from poly-filled trenches 92. As already explained in connection with devices 70 of FIGS. 4-5, the presence of N+ poly-filled trench 92 allows source-drain current 96 to spread deeper into N-well 36, thereby avoiding current crowding at drain region 71 and reducing the ON-resistance of devices 90. Also, as explained in connection with device 70-2 of FIG. 5, the use of poly-filled trench 92-2 reduces the thermal impedance from the active regions of device 90-2 to substrate 22, which is highly desirably. Devices 90 may be laterally mirrored about a plane passing through poly-filled trench 92, but this is not essential.

Figure 8:
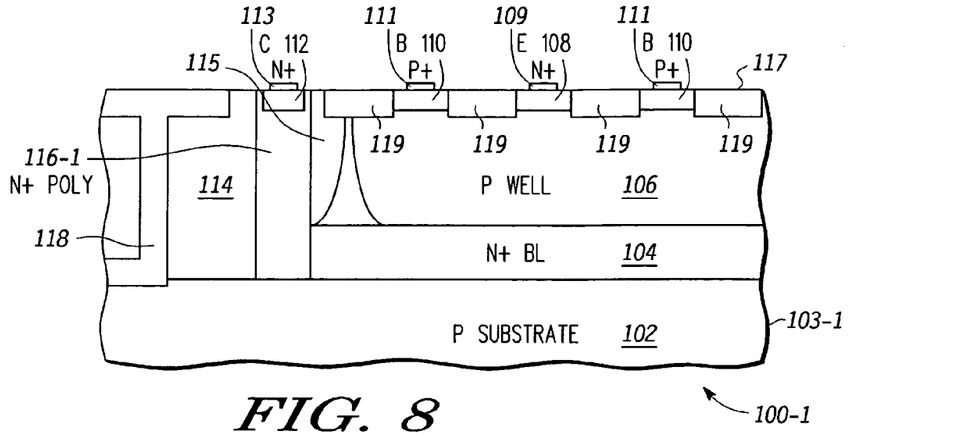
Figure 9:
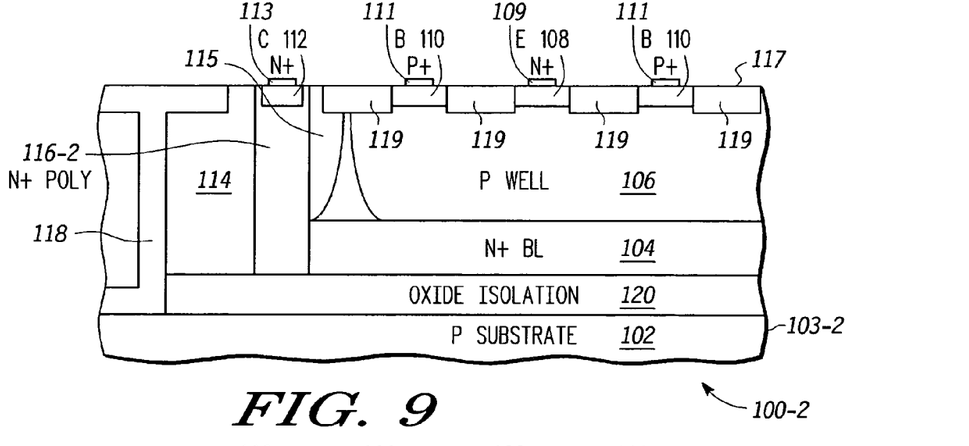
Figure 10:
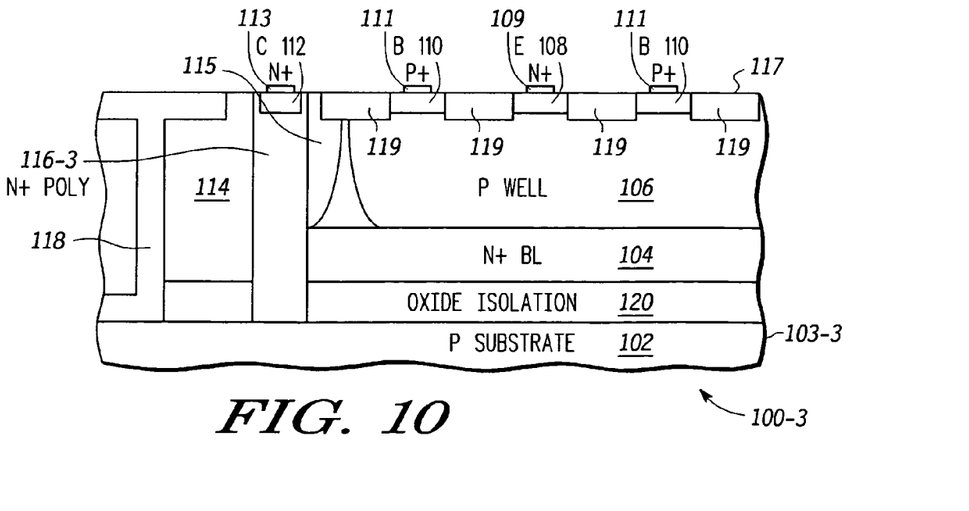

FIGS. 8-10 illustrate the use of poly-filled trenches to improve the performance of vertical bipolar devices, for example, NPN vertical devices 100-1, 100-2, 100-3 (collectively "100"). Devices 100-1, 100-2, and 100-3 differ in: (a) the presence or absence of oxide isolation layer 120 (analogous to layers 88, 88' of FIGS. 5 and 7), and (b) how deeply poly-filled trenches 116-1, 116-2, 116-3 (collectively 116) extend into devices 100. Because of their general similarity, devices 100 are described together. Devices 100 comprise P substrate 102 (analogous to P substrate 22 of FIGS. 1-2 and 4-7, and P substrate 152 of FIGS. 11-13) and N+ BL 104 (analogous to N+ BL 24, 156). In device 100-1, N+ BL 104 overlies P substrate 102 and in devices 100-2 and 100-3, N+ BL 104 overlies oxide isolation layer 120 (analogous to layer 88, 88'). P well 106 is provided above N+ BL 104 and acts as the base region of vertical NPN transistor 100. N+ Emitter region 108 with connection 109 and P+ base contact regions 110 with connections 111 are provided in surface 117 of P well 106. Deep N-well region 114 is provided extending from surface 117 to N+ BL 104. N-well region 114 has N+ collector contact region 112 with connection 113 therein at upper surface 117. Oxide or other dielectric regions 119 are conveniently but not essentially provided at surface 117 separating collector, base and emitter regions 112, 110 and 108. Lateral oxide (or other dielectric) isolation wall 118 is conveniently also provided adjacent N-well 114, but this is not essential. N+ poly-filled trenches 116-1, 116-2, 116-3 (collectively 116) are provided extending from collector contact 112 through N well 114 at least to N+ BL 104. In device 100-1, N+ poly-filled trench 116-1 desirably but not essentially extends through N+ BL 104 to substrate 102. Since it is of opposite conductivity type to substrate 102, it is electrically isolated from P substrate 102 by the PN junction formed therebetween, or where it does not penetrate to substrate 102 by the PN junction formed between N+ BL 104 and P substrate 102. In device 100-2, N+ poly-filled trench 116-2 desirably (but not essentially) extends through N+ BL 104 to oxide isolation layer 120. In device 100-3, N+ poly-filled trench 116-3 extends through oxide isolation layer 120 and makes thermal contact with substrate 102. When oxide isolation layer 120 is present, the arrangement of FIG. 10 with poly-filled trench 116-3 extending through oxide isolation layer 120 to substrate 102 is preferred because of the lower thermal impedance which it imparts to device 100-3. While the devices of FIGS. 8-10 have been described for the case of a vertical NPN, persons of skill in the art will understand that the principals taught herein apply equally well to PNP devices with appropriate changes of conductivity types of the various device regions. Additional device active regions may be formed beyond boundaries 103-1, 103-2, and 103-3 (collectively 103) in the same isolation tubs, but this is not essential. For example, devices 100 may be laterally mirrored about a plane passing vertically through emitter region 108, but this is not essential.

Figure 11:
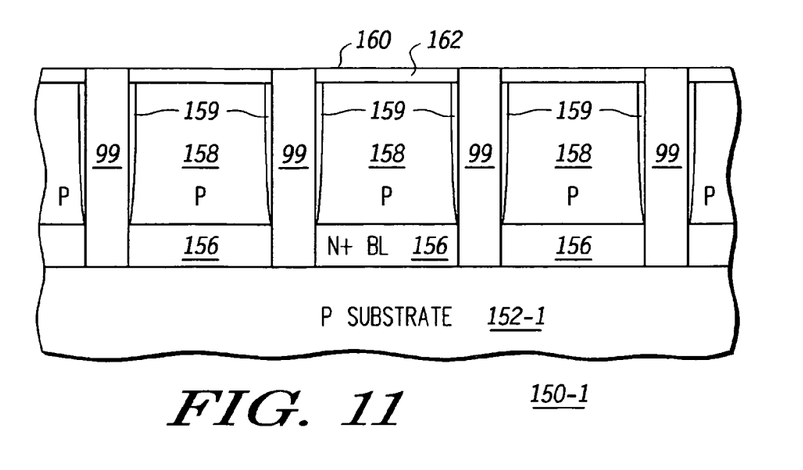
FIGS. 11-13 are simplified schematic cross-sectional side views through further types of semiconductor devices illustrating the use of poly-filled trenches for improved heat removal from temperature sensitive regions of the devices, according to various embodiments.
Figure 12:
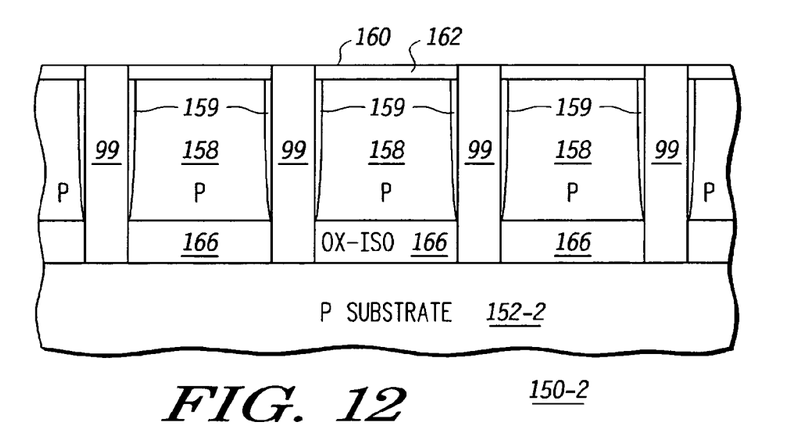
Figure 13:
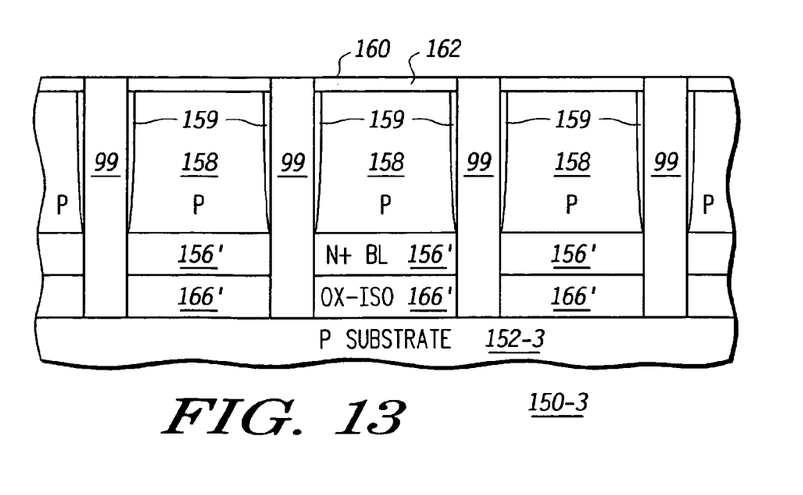

FIGS. 11-13 are simplified schematic cross-sectional side views through further types of semiconductor devices 150-1, 150-2, 150-3 (collectively "150") illustrating the use of poly-filled trenches primarily for improved heat removal from temperature sensitive regions of devices. For convenience of explanation, the usual active device regions are omitted from FIGS. 11-13. FIGS. 11-13 differ in whether or not a buried layer (layer 156) or an oxide isolation layer (layer 166) or both (layers 156' and 166') are included. Devices 150 are assumed to be otherwise similar and are described together. Devices 150 comprise P substrate 152 analogous to substrate 22 and 102 of FIGS. 1-2, 6-7 and 8-10. In device 150-1 of FIG. 11, N+ BL 156 analogous to N+ BL 24 and 104 of FIGS. 1-2, and 6-10 is provided on P substrate 152-1. In device 150-2 of FIG. 12, oxide isolation layer 166 analogous to layer 88 and 88' of FIGS. 5 and 7 and 120 of FIGS. 9-10, is provided on substrate 152-2. In device 150-3 of FIG. 13, both N+ BL 156' and oxide isolation layer 166' are provided, on substrate 152-3 as shown. P Epi-layer 158 is provided on N+ BL 156 in device 150-1 of FIG. 11, on oxide isolation layer 166 in device 150-2 of FIG. 12 and on N+ BL 156' in device 150-3 of FIG. 13. Conventional lateral dielectric isolation walls (not shown) may be provided extending from surface 160 to P substrate 152 analogous to walls 32 of FIGS. 1-2, 4-5, 6-7, but these are not essential to the embodiments of the present invention. Surface dielectric (e.g., oxide) regions 162 may also be provided at surface 160 of devices 150 but are not essential. Poly-filled trenches 99 are provided extending from surface 160 through intervening layers or regions 156, 158, 166 to substrate 152, to provide improved thermal conduction to substrate 152. N-doped regions 159 may form due to outdiffusion from N+ poly-dilled trenches 99, but this is not essential. It will be noted that poly-filled trenches 99 do not require an oxide lining to provide electrical separation from the surrounding regions, although such a trench liner is not precluded. In general, the conductivity type of the poly-filling in the trench is selected to provide PN junction isolation from adjacent regions where required. The same applies to poly-filled trenches 58, 86, 92, 116 in FIGS. 1-2, 4-10, that is, dielectric liners are not needed but not precluded.

Figure 14:
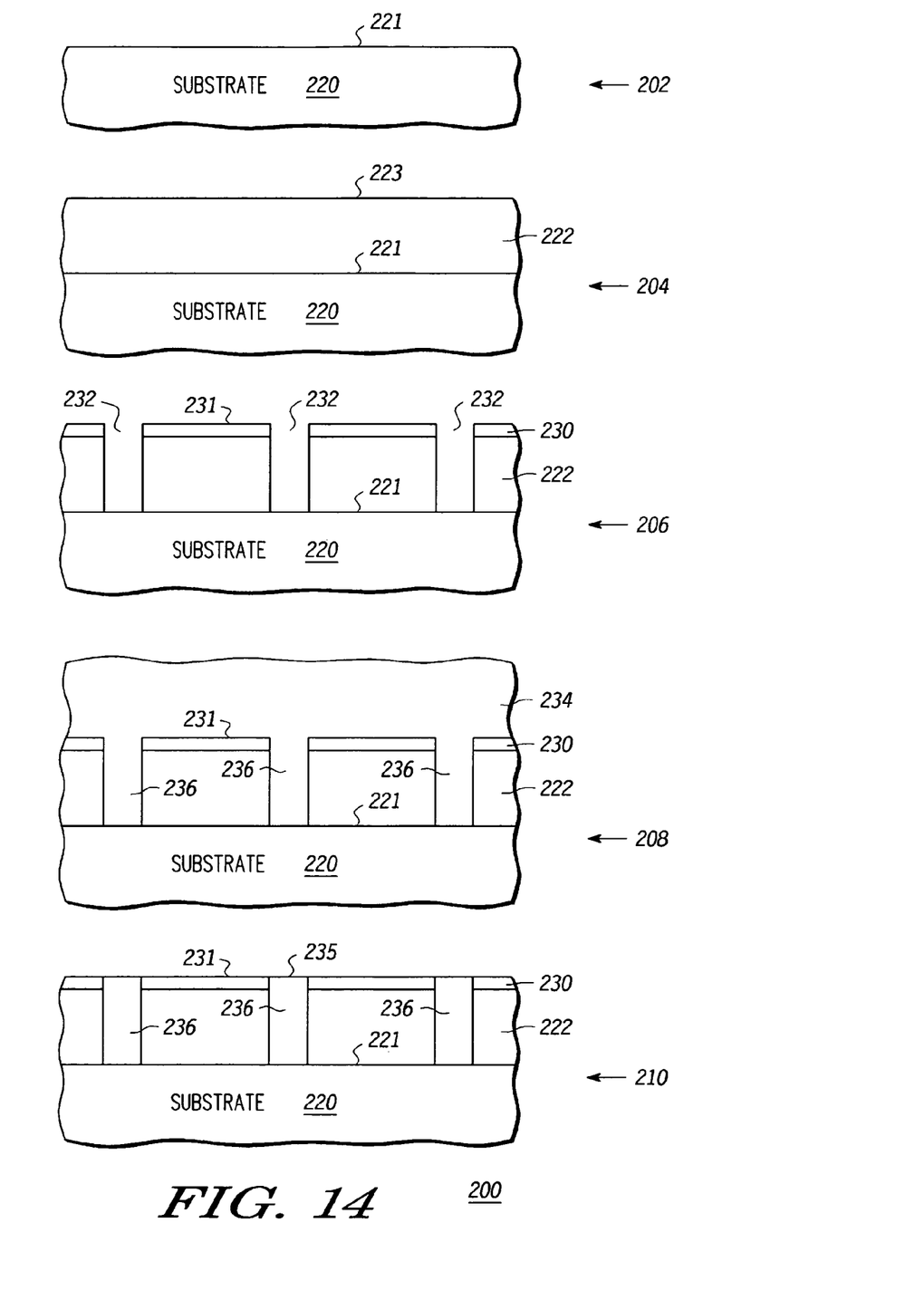
FIGS. 14-15 show a series of schematic cross-sectional side views of a semiconductor substrate during various stages of manufacture illustrating methods for forming poly-filled trenches according to embodiments of the present invention.

FIG. 14 shows a series of schematic cross-sectional side views 202-210 of a semiconductor substrate during various stages of manufacturing illustrating method 200 for forming the poly-filled trenches employed in embodiments of the present invention where no buried oxide isolation layer is being used. Method 200 shows the steps conveniently used to provide any of poly-filled trenches 58, 86-1, 92-1, and 99 of device 152-1, without an oxide isolation layer. Those additional steps needed to provide the various further device regions with which the poly-filled trenches may be associated are well understood in the art, will vary from device to device and are therefore omitted here. Method 200 begins with step 202 wherein P+ substrate 220 analogous to substrate 22, 102, 152 and having upper surface 221 is provided. In step 204, layer 222 having upper surface 223 and analogous to layers 28, 81 is formed on surface 221. Layer 222 may be either N or P type according to the needs of the particular device being formed and may include next to surface 221 a buried layer (not shown) analogous to buried layers 24 and 104. Any convenient doping means maybe used for providing a buried layer. In step 206, trenches 232 are formed, e.g., by masking and etching, extending through semiconductor layer 222 to substrate 220. Before or after formation of trenches 232, etch-stop and/or polishing-stop layer 230 may be formed on and/or in surface 223 of semiconductor layer 222. Layer 230 is conveniently of silicon oxide, silicon nitride or a combination thereof and is conveniently provided to facilitate removal of excess poly from surface 231. However, layer 230 is not essential. In step 208, polycrystalline semiconductor (e.g., poly-silicon) of the desired conductivity and conductivity type is deposited on surface 231 of sufficient thickness to insure that trenches 232 are filled to form poly-filled trenches 236 analogous to poly-filled trenches 58, 86, 92, 99 of FIGS. 1-2, 4, 6, 8, and 11. In step 210, the excess poly lying above surface 231 is removed, as for example, by mechanical polishing or chemical etching or a combination thereof, so that surfaces 235 of poly-filled trenches 236 are substantially planar with surface 231. The various further regions illustrated in FIGS. 1-2, 4, 6, 8, and 11 may be formed at intermediate stages or after step 210 of method 200, whichever is most convenient depending upon the particular type of device being built in or on semiconductor layer 222. Persons of skill in the semiconductor art will understand how to do this. As will be also understood by persons of skill in the art, the location of poly-filled trenches 236 is determined by the etch mask used to determine the location of trenches 232.

Figure 15:
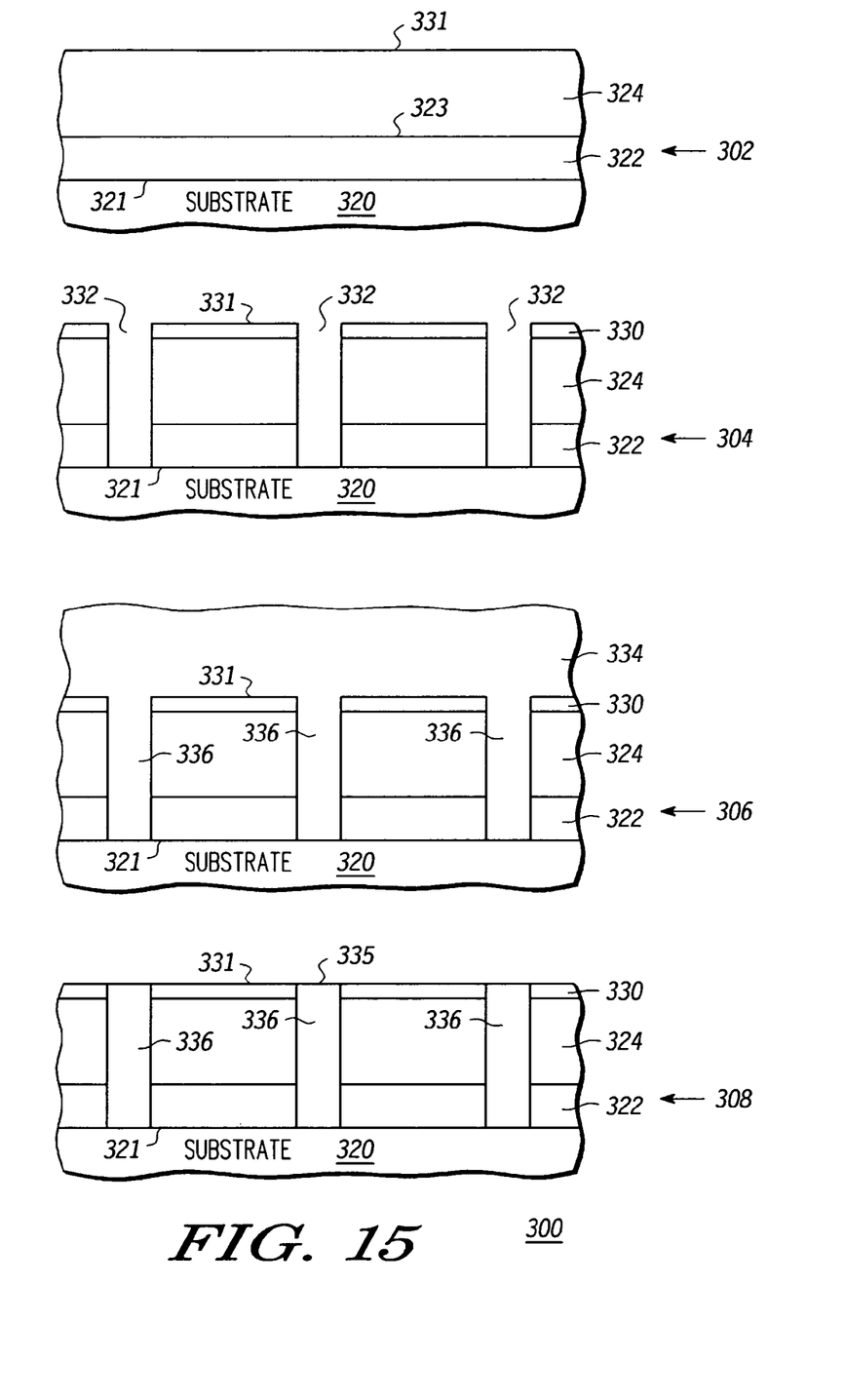

FIG. 15 shows a series of schematic cross-sectional side views 302-308 of a semiconductor substrate during various stages of manufacturing illustrating method 300 for forming the poly-filled trenches employed in embodiments of the present invention where a buried oxide isolation layer is being used, i.e., an SOI structure. Method 300 shows the steps conveniently used to provide any of poly-filled trenches 86-2, 92-2, 99 of devices 152-2, 152-3, and trenches 116-2, 116-3 of devices 100-2, 100-3 which have an oxide isolation layer. Those additional steps needed to provide the various further device regions with which the poly-filled trenches may be associated are well understood in the art, will vary from device to device and are therefore omitted here. Method 300 begins with step 202 wherein P+ substrate 320 with oxide isolation layer 322 and N or P layer 324 thereon is provided. Substrate 320 is analogous to substrate 22, 102, 152. Oxide isolation layer 322 is analogous to layers 88, 88', 120, 166 and 166'. Layer 324 is analogous to the layer containing N-well 81, P(epi) layer 28, the layer containing P-well 106, and layer 158. A buried layer (not shown) may be provided within layer 324 adjacent surface 323, depending upon the needs of the device. Any convenient doping means may be used to provide such buried layer. Wafers having the configuration shown in step 302 are commercially available and may be fabricated by a number of well known techniques including dielectric isolation and wafer bonding. Upper surface 331 may be determined by lapping or polishing or other well known technique. For example, the structure shown in step 302 can be prepared by forming an oxide on a single crystal wafer that eventually becomes layer 324. Poly is then deposited or grown on the oxide layer to a thickness sufficient to form substrate 320. Then the single crystal wafer is lapped back to the thickness desired for layer 324. The poly layer becomes substrate 320 and the single crystal wafer becomes layer 324 with oxide isolation layer 322 in between. Other techniques well known in the art for forming the structure shown in step 302 may also be used.

In step 304, trenches 332 are formed, e.g., by masking and etching, preferably but not essentially extending through semiconductor layer 324 and isolation layer 322 to substrate 320. Before or after formation of trenches 332, etch-stop and/or polishing-stop layer 330 may be formed on and/or in surface 331 of semiconductor layer 324. Layer 330 is conveniently of silicon oxide, silicon nitride or a combination thereof and is conveniently provided to facilitate removal of excess poly from surface 331. However, layer 330 is not essential. In step 306, polycrystalline semiconductor (e.g., poly-silicon) of the desired conductivity and conductivity type is deposited on surface 331 of sufficient thickness to insure that trenches 332 are filled to form poly-filled trenches 336 analogous to poly-filled trenches 86-2, 92-2, 99 and 116-2, 166-3 of FIGS. 5, 7, 9-10, and 12-13. In step 308, the excess poly lying above surface 331 is removed, as for example, by mechanical polishing or chemical etching or a combination thereof, so that surfaces 335 of poly-filled trenches 336 are substantially planar with surface 331. The various further regions illustrated in FIGS. 5, 7, 9-10, and 12-13 may be formed at intermediate stages or after step 308 of method 300, whichever is most convenient depending upon the particular type of device being built in or on semiconductor layer 324. Persons of skill in the semiconductor art will understand how to do this. As will be also understood by persons of skill in the art, the location of poly-filled trenches 336 is determined by the etch mask used to determine the location of trenches 332.

A semiconductor device according to first exemplary embodiment comprises, a source region, a drain region and a gate region operatively coupled to form a transistor, a buried layer underlying at least a portion of the transistor and of the same conductivity type as the source region, an enclosing isolation region overlying a portion of the buried layer and separated from the source, drain and gate regions and of the same conductivity type as the source region, and a poly-filled trench extending from the buried layer through a part of the enclosing isolation region and electrically coupled to the source region. According to a further embodiment, the poly-filled trench has the same conductivity type as the source. According to a still further exemplary embodiment, the source, drain and gate form a lateral transistor. According to a yet further exemplary embodiment, the source, drain and gate form an LDMOS transistor. According to a still yet further exemplary embodiment, the source, drain and gate form an ILDMOS transistor.

A semiconductor device according to a second exemplary embodiment comprises, a first region of a first conductivity type formed in the device, a second region of a second opposite conductivity type underlying and spaced apart from the first region, and a poly-filled trench of the first conductivity type extending from the first region to the second region. According to a further exemplary embodiment, the device further comprises a buried layer of the first conductivity type located between the first and second regions and electrically coupled to the poly-filled trench. According to a still further exemplary embodiment, the device further comprises an oxide isolation layer penetrated by the poly-filled trench and lying between the first and second regions. According to a yet still further exemplary embodiment, the device further comprises a buried layer of the first conductivity type located between the first region and the oxide isolation layer and electrically coupled to the poly-filled trench. According to a still yet further embodiment the first region is a drain region and the second region is a substrate of the device. According to a still further additional embodiment, the first region is a collector region and the second region is a substrate of the device. According to an additional embodiment, the device further comprises, a buried layer of the first conductivity type overlying the second region and underlying the first region and separated therefrom, and a third region of the second conductivity type laterally separated from the first region and the poly-filled trench and extending substantially from an outer surface of the device to the third region.

A semiconductor device according to a second exemplary embodiment comprises, a substrate of a first conductivity type and having a first surface, a semiconductor layer of the first or a second opposite conductivity type on the first surface and having a second surface opposite the first surface, and a trench filled with polycrystalline semiconductor of a conductivity type opposite the conductivity type of the semiconductor layer and extending substantially through the semiconductor layer from the second surface at least to the first surface. According to an additional embodiment, the device further comprises an oxide isolation layer between the first surface and the semiconductor layer. According to a yet further embodiment the trench extends substantially through the buried layer and the oxide isolation layer.

A method for forming a semiconductor device according to an exemplary embodiment, comprises providing a semiconductor substrate having a first outer surface, forming one or more semiconductor layers on the first outer surface, wherein an outermost layer of the one or more semiconductor layers has a second outer surface, etching one or more trenches extending from the second outer surface toward the first surface, and filling the one or more trenches with a polycrystalline semiconductor. According to a further exemplary embodiment, the method further comprises between the forming and filling steps, providing a polishing stop layer on the second surface. According to a still further exemplary embodiment, the filling step comprises, depositing polycrystalline semiconductor on the polishing stop layer to a thickness sufficient to fill the trenches, and removing the polycrystalline semiconductor lying above the polishing stop layer. According to a yet still exemplary embodiment, the providing and forming steps comprise, providing a first semiconductor substrate, forming an oxide layer on the first semiconductor substrate, providing a second semiconductor bonded to the first semiconductor substrate, and removing a part of the first semiconductor substrate to form the second outer surface of the one or more semiconductor layers.

While at least one exemplary embodiment has been presented in the foregoing detailed description, it should be appreciated that a vast number of variations exist. For example, the various devices described herein are shown as employing N+ poly-filled trenches in connection with various P-type and N-type regions used to construct a particular device, but these example are not intended to be limiting and use of particular N or P types are merely for convenience of explanation. Persons of skill in the art will understand that the principals taught herein also apply to P+ poly-filled trenches, coupled with appropriate modifications of the other layers and regions in which or with which such poly-filled trenches are used. Thus, it is appropriate to describe the poly-filled trenches and various other device regions as having a "first" conductivity type, which can be either N or P, and other device regions as having a "second" opposite conductivity type, which can be either P or N, and so forth. It should also be appreciated that the exemplary embodiment or exemplary embodiments are only examples, and are not intended to limit the scope, applicability, or configuration of the invention in any way and P can be substituted for N and N can be substituted for P in the poly-filled trenches and other device regions. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device, comprising:
   a substrate of a first conductivity type and having a substrate surface;
   a source region, a drain region and a gate region operatively coupled to form a transistor;
   a buried layer over the substrate surface and underlying at least a portion of the transistor, wherein the buried layer is of a same conductivity type as the source region;
   an epitaxial layer located above the buried layer and of an opposite conductivity type as the source region, wherein the epitaxial layer has an epitaxial layer surface;
   an enclosing isolation region within the epitaxial layer, overlying a portion of the buried layer and separated from the source region, wherein the enclosing isolation region is of the same conductivity type as the source region; and
   a poly-filled trench surrounded by the enclosing isolation region, the poly-filled trench extending from the substrate through the buried layer and through the enclosing isolation region.

2. The device of claim 1, wherein the poly-filled trench has the same conductivity type as the source region.

3. The device of claim 1, wherein the poly-filled trench extends to the epitaxial layer surface.

4. The device of claim 1, wherein the poly-filled trench extends to the drain region.

5. The device of claim 1, wherein the enclosing isolation region is separated from the source region by at least a portion of the epitaxial layer.

6. The device of claim 1, further comprising:
   an insulating dielectric isolation layer between the substrate surface and the buried layer, wherein the poly-filled trench also extends through the insulating dielectric isolation layer.

7. The device of claim 2, wherein the source region, the drain region and the gate region form a lateral transistor.

8. The device of claim 7, wherein the source region, the drain region and the gate region form an LDMOS transistor.

9. The device of claim 8, wherein the source region, the drain region and the gate region form an ILDMOS transistor.

10. A semiconductor device, comprising:
    a drain region of a first conductivity type formed in an epitaxial layer of the device;
    the epitaxial layer of a second opposite conductivity type;
    a substrate of the second opposite conductivity type underlying and spaced apart from the drain region by the epitaxial layer;
    a poly-filled trench of the first conductivity type extending from the drain region to or into the substrate; and a buried layer of the first conductivity type located between the drain region and the substrate, and electrically coupled to the poly-filled trench.
    an enclosing isolation region surrounding the poly-filled trench and of the first conductivity type.

11. The device of claim 10, further comprising an oxide isolation layer penetrated by the poly-filled trench and formed between the drain region and the substrate.

12. The device of claim 10, further comprising:
    a buried layer of the first conductivity type overlying the substrate and underlying the drain region and separated therefrom; and
    a region of the second conductivity type laterally separated from the drain region and the poly-filled trench and extending substantially from an outer surface of the device to the substrate.

13. The device of claim 11, further comprising a buried layer of the first conductivity type located between the drain region and the oxide isolation layer, and electrically coupled to the poly-filled trench.

14. A semiconductor device, comprising:
    a substrate of a first conductivity type and having a first surface;
    a semiconductor layer of the first or a second opposite conductivity type on the first surface and having a second surface opposite the first surface;
    a trench filled with polycrystalline semiconductor of a conductivity type opposite the conductivity type of the semiconductor layer and extending through the semiconductor layer from the second surface to the first surface or into the substrate;
    an oxide isolation layer between the first surface and the semiconductor layer and a buried layer of conductivity type opposite the conductivity type of the semiconductor layer between the first surface and the semiconductor layer.

15. The device of claim 14, wherein the trench extends substantially through the buried layer and the oxide isolation layer.

* * * * *